(12) United States Patent
Sayers

(10) Patent No.: US 6,813,486 B2
(45) Date of Patent: Nov. 2, 2004

(54) RF CIRCUIT

(75) Inventor: Anthony D. Sayers, Crawley (GB)

(73) Assignee: Koninklijke Philips Electronics N.V., Eindhoven (NL)

(*) Notice: Subject to any disclaimer, the term of this patent is extended or adjusted under 35 U.S.C. 154(b) by 549 days.

(21) Appl. No.: 09/862,284

(22) Filed: May 22, 2001

(65) Prior Publication Data

US 2003/0054791 A1 Mar. 20, 2003

(30) Foreign Application Priority Data

Jun. 1, 2000 (GB) .............................................. 0013171
Jun. 1, 2000 (GB) .............................................. 0013172

(51) Int. Cl.[7] .............................. H04B 1/10; H04B 1/16; H04B 1/18
(52) U.S. Cl. ...................... 455/338; 455/284; 455/305; 330/117; 330/275; 330/301
(58) Field of Search ..................... 455/80–81, 280–284, 455/303, 305, 326, 338, 341; 330/301, 302, 305, 375, 117; 333/25, 175, 32, 124, 4

(56) References Cited

U.S. PATENT DOCUMENTS 5,039,891 A * 8/1991 Wen et al. ................... 327/113
5,148,130 A * 9/1992 Dietrich ....................... 333/25
5,412,355 A * 5/1995 Lee ............................ 333/124
5,684,430 A * 11/1997 Yamamoto .............. 330/124 R
5,726,603 A * 3/1998 Chawla et al. ............... 330/269
5,736,840 A * 4/1998 Otaka et al. ................. 323/217
6,128,479 A * 10/2000 Fitzpatrick et al. .......... 455/137

FOREIGN PATENT DOCUMENTS

CA          0 926 821 A2 *  6/1999    ........... H03H/11/20
EP           0926821 A2      6/1999    ............ H03H/1/20

* cited by examiner

Primary Examiner—Simon Nguyen
(74) Attorney, Agent, or Firm—Aaron Waxler

(57) ABSTRACT

An RF circuit configured to inteface a balanced port (1, 2, 11, 12) with an unbalanced port (4, 14) by emulating the function of a balun. Reactive components (20, 30, 120, 130) in both branches of a balanced circuit form two resonant circuits by resonating with parasitic reactance. At a predetermined operating centre frequency, one of the two resonant circuits is above resonance and the other is below resonance, resulting in a 180° phase difference between the signals delivered by the two branches. When used to interface an unbalanced signal source (10) to a balanced load (40), the input impedance may be set to a real value matching the output impedance of the signal source by selection of the reactive component (20, 30) values.

14 Claims, 5 Drawing Sheets

RF CIRCUIT

The invention relates to an RF circuit configured to match an unbalanced port to a balanced port and has particular, but not exclusive, application to radio receivers, transmitters and transceivers, including integrated circuits used to implement radio receivers.

Integrated circuits operating at radio frequencies usually have differential inputs, whereby a two inputs form a balanced pair of inputs to an amplifier. Such inputs should be supplied with signals that are equal in amplitude but 180° out of phase. Many radio frequency (RF) signal sources, such as an antenna, provide a non-differential, unbalanced signal. It is common practice to match such signal sources to such integrated circuits by using a balun to convert an unbalanced signal from an unbalanced signal source to a balanced signal for connection to a balanced pair of inputs. In this application, the basic function of a balun is to generate two versions of the source signal 180° out of phase with respect to each other.

Furthermore, integrated circuits operating at radio frequencies usually have differential outputs, whereby two outputs from a differential output stage form a balanced pair. Such outputs supply signals that are equal in amplitude but 180° out of phase. Many radio frequency (RF) load devices, such as an antenna, require a non-differential, unbalanced signal. It is common practice to match such load devices to such integrated circuits by using a balun to convert a balanced signal pair to an unbalanced signal for connection to an unbalanced load device. In this application, the basic function of the balun is to convert two versions of a signal 180° out of phase with respect to each other to an unbalanced signal by inverting one signal and combining the pair.

Baluns are available as off-the-shelf modules, but these are expensive and generally have quite a high loss.

Baluns can also be implemented using discrete capacitors and inductors, but it is desirable to reduce component count, cost and volume further.

Baluns can be implemented as printed components on a printed circuit board, but would be large at some operating frequencies, for example 2.4 GHz.

An object of the present invention is to provide an improved RF circuit configured to match a balanced port to an unbalanced port.

According to one aspect of the invention there is provided an RF electrical circuit configured to match an unbalanced port to first and second terminals of a balanced port, comprising first and second branches, the first branch comprising a first path coupling the unbalanced port and the second terminal of the balanced port and the second branch comprising a second path coupling the unbalanced port to the second terminal of the balanced port, the first path comprising a first reactive element and the second path comprising a second reactive element, wherein the first reactive element resonates at a first resonant frequency with a first parasitic reactance associated with the first branch, wherein the second reactive element resonates at a second resonant frequency with a second parasitic reactance associated with the second branch, wherein the first resonant frequency is higher than a predetermined operating centre frequency and the second resonant frequency is lower than the predetermined operating centre frequency, and wherein signals delivered to a load from the first and second branches are 180° out of phase with respect to each other.

According to another aspect of the invention there is provided an RF electrical circuit wherein the balanced port comprises an amplifier and the first. and second terminals of the balanced port comprise respectively amplifier first and second inputs, wherein the first branch comprises the amplifier first input and the second branch comprises the amplifier second input, wherein the first reactive element comprises a first inductor having a first inductance and the second reactive element comprises a second inductor having a second inductance, and wherein the first parasitic reactance associated with the first branch comprises an input capacitance of the amplifier first input and the second parasitic reactance associated with the second branch comprises an input capacitance of the amplifier second input.

In one embodiment of the invention there is an input port for receiving an unbalanced signal from a signal source, and an RF amplifier implemented in a CMOS integrated circuit and having a pair of balanced inputs. Two inductors are connected between the input port and the two balanced inputs of the amplifier, one to each input. Each inductor forms a series tuned circuit with the inherent parasitic input capacitance of its respective input of the amplifier. At the resonant frequency of each tuned circuit, the voltage at each respective input changes by 180°. The two inductors have different values such that, at the operating centre frequency of the circuit, one tuned circuit is below resonance and the other resonant circuit is above resonance. In this state, there is a 180° phase difference between the inputs to the amplifier, and the circuit performs the function of a balun.

The input impedance presented to the signal source at the input port is determined by the two inductor values, in conjunction with the internal parasitic resistance of the inductors and the parasitic capacitance of the inputs of the amplifier, and consequently can be set by selection of the resonant frequencies of the two series tuned circuits.

In general, signal sources exhibit a real, not complex, output impedance, and need to be matched with a real load impedance. In order to ensure that the input impedance presented to the signal source at the input port is substantially real, the inductor values are further selected such that the operating centre frequency is substantially midway between the resonant frequencies of the two series tuned circuits.

The value of the input impedance at the input port may be adjusted to achieve a match with the output impedance of the signal source, for example 50Ω, by selection of the difference between the two inductor values, and consequently by selection of the spacing of the resonant frequencies from the operating centre frequency.

In this way, matching of an unbalanced signal source to a balanced pair of inputs to an integrated amplifier is achieved using only two inductors in combination with inherent parasitic characteristics, resulting in low component count, low component cost, and low component volume.

According to a further aspect of the invention there is provided an RF electrical circuit wherein the balanced port comprises an integrated circuit die and the first and second terminals of the balanced port comprise respectively first and second outputs of a differential signal source on respectively first and second connection areas of the integrated circuit die, wherein the first branch comprises the integrated circuit die first output and the second branch comprises the integrated circuit die second output, wherein the first reactive element comprises a first capacitor having a first capacitance and the second reactive element comprises a second capacitor having a second capacitance, wherein the first parasitic reactance associated with the first branch comprises a first parasitic inductance and the second parasitic reactance associated with the second branch comprises a second parasitic inductance.

In a second embodiment of the invention there is an output port for delivering an unbalanced signal to a load device, and a CMOS or bipolar integrated circuit die presenting, on a pair of connection areas, a pair of balanced outputs of a differential signal source. Each of the pair of connection areas is coupled to a respective connection pin of an integrated circuit package by means of a bond wire. A capacitor is coupled between each connection pin and the output port. Each capacitor forms a series tuned circuit with the parasitic inductance inherent in the interconnections of the respective branch; these interconnections encompass integrated circuit die to connection pin, connection pin to capacitor, and capacitor to output port. At a resonant frequency of each tuned circuit, the voltage in each respective tuned circuit changes by 180°. The two capacitors are selected such that, at the operating centre frequency of the signal source, one tuned circuit is below resonance and the other tuned circuit is above resonance. In this state, there is a 180° phase difference between the signals in the two tuned circuits, and the pair of tuned circuits performs the function of a balun.

In a third embodiment of the invention any one or two of the three interconnections listed above in each branch may be configured to have no significant parasitic inductance. For example, placing the output port physically close to the capacitors may effectively eliminate parasitic inductance on the output port side of the capacitors. As another example, the integrated circuit may be mounted as a naked die without a package, or within a package in a manner that results in a negligible amount of parasitic inductance within the package. In this second embodiment each tuned circuit comprises the capacitor and the parasitic inductance present in the interconnections of the respective branch.

The load impedances presented to the differential signal source outputs are determined by the two capacitor values, in conjunction with the respective parasitic inductance of the interconnections, and consequently, by selection of the resonant frequencies of the two series tuned circuits, the load impedance presented to each output of the differential signal source can be made equal, and small in relation to the impedance of the load device.

In this way, matching of a differential signal source to an unbalanced load device is achieved using only capacitors in combination with inherent parasitic characteristics, resulting in low component count, low component cost, and low component volume.

The invention will now be described, by way of example, with reference to the accompanying drawings wherein.

In the drawings the same reference numerals have been used to indicate corresponding features.

Figure 1:
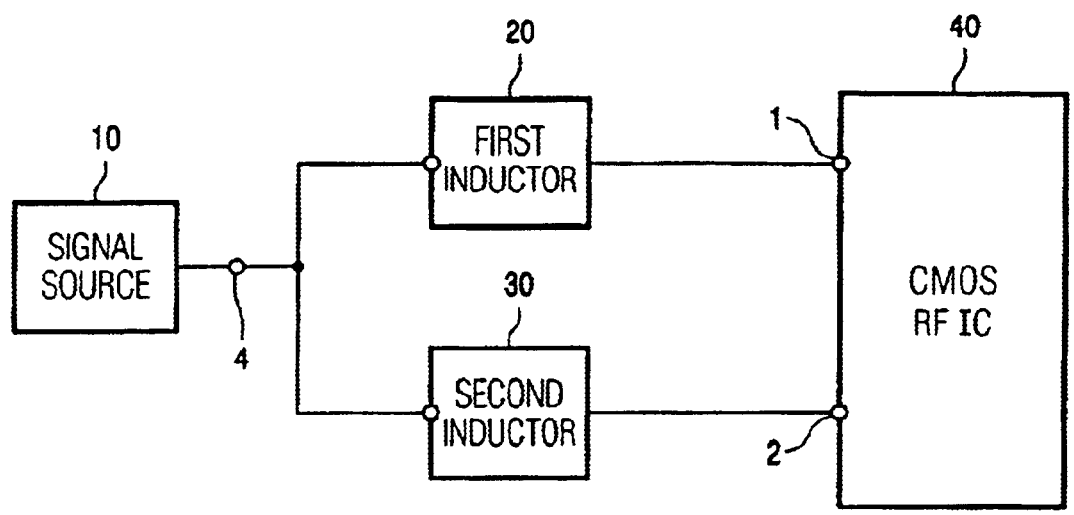
FIG. 1 is a block schematic diagram illustrating a first embodiment of the circuit.
Figure 2:
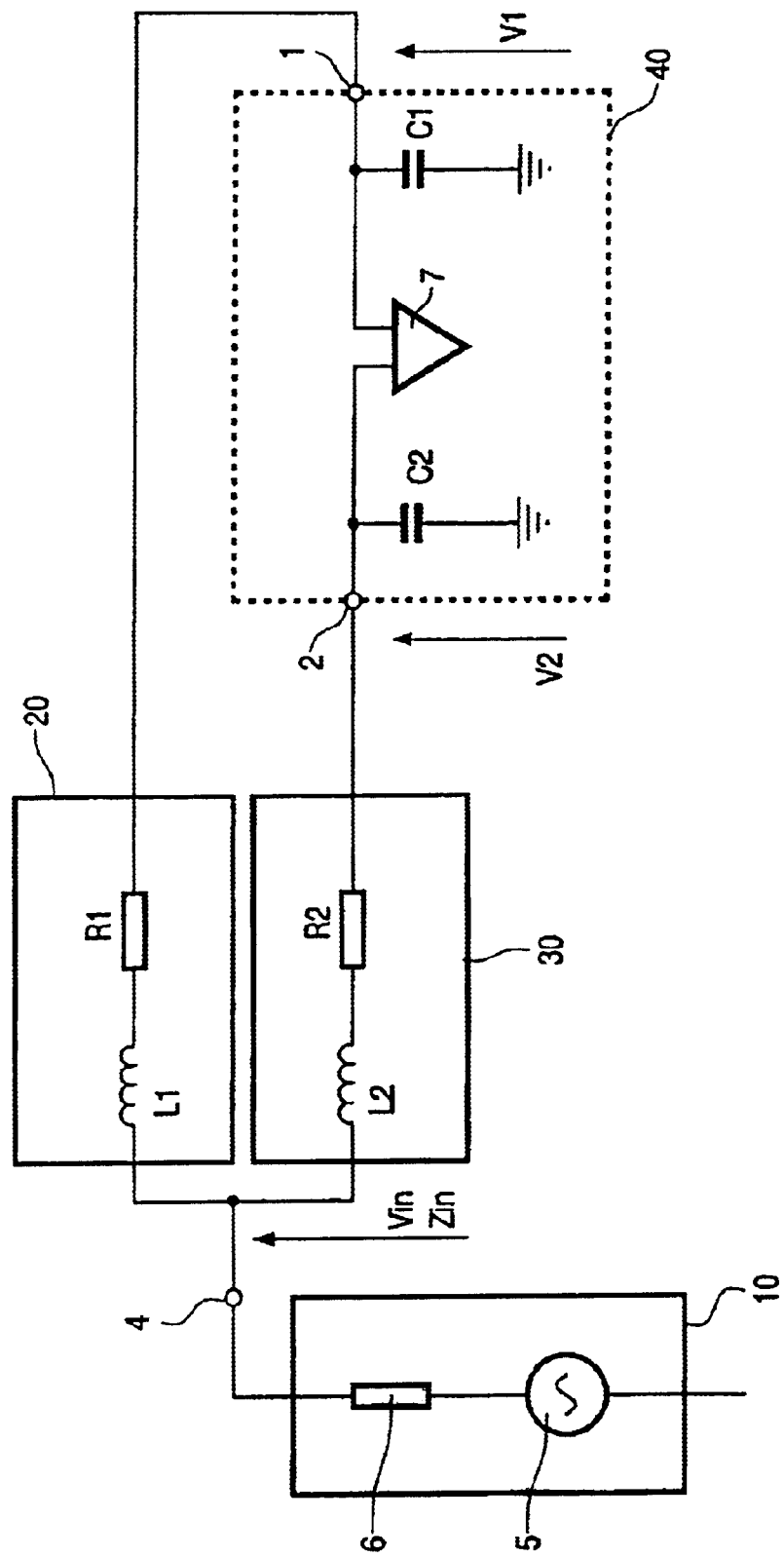
FIG. 2 is a schematic circuit diagram of the circuit embodiment in FIG. 1.

Referring to FIGS. 1 and 2 which illustrate a first embodiment, there is a signal source 10, which may, for example, be an antenna, coupled to an input port 4. The input port 4 is coupled to a first inductor 20 and a second inductor 30. An output from the first inductor 20 is supplied to a first input 1 of an amplifier 7 (in FIG. 2) contained within a CMOS RF integrated circuit 40, and an output from the second inductor 30 is supplied to a second input 2 of the amplifier 7, where the first and second inputs 1, 2 of the amplifier are configured as a balanced pair. The integrated circuit 40 includes the amplifier, and may be, for example, an integrated radio receiver or the integrated front end of a radio receiver.

Referring to FIG. 2, the signal source 10 is represented by a voltage generator 5 and an internal resistance 6 of, for example, 50Ω. The first inductor 20 is represented by an inductance $L_1$ in series with an internal resistance $R_1$. The second inductor 30 is represented by an inductance $L_2$ in series with an internal resistance $R_2$.

Internal to the integrated circuit 40 there is parasitic capacitance $C_1$ between the first input 1 and ground, and parasitic capacitance $C_2$ between the second input 2 and ground. Other internal circuitry of the integrated circuit 40 is not shown in FIG. 2 because it is not essential to the understanding of the present invention. Other inputs to, and outputs from, the integrated circuit 40 which are not essential to the understanding of the present invention are not shown.

Figure 3:
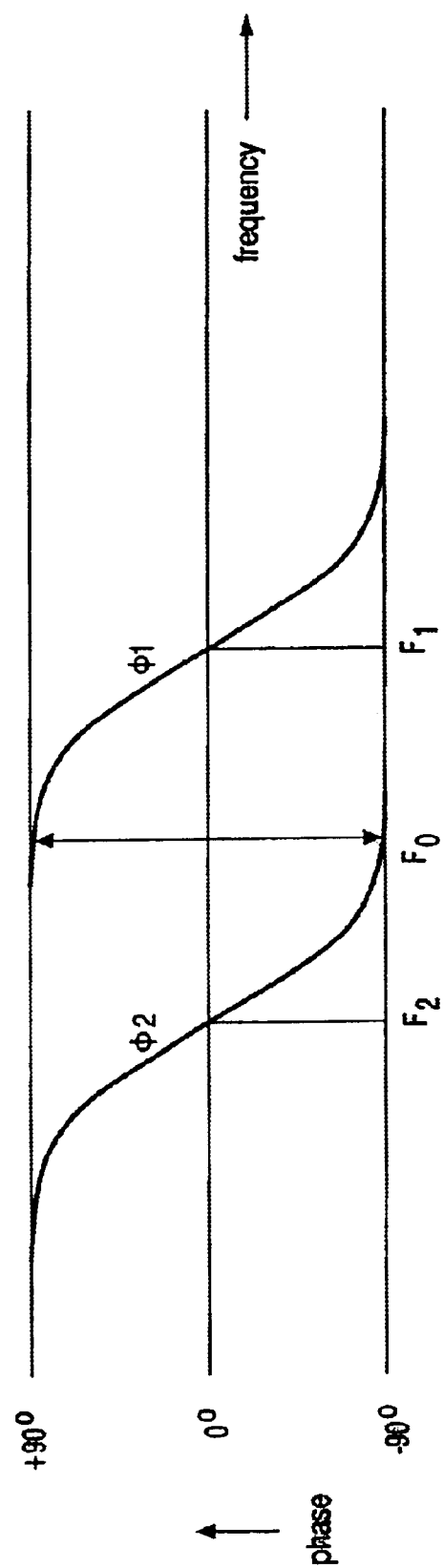
FIG. 3 is a plot of the phase of the voltage at amplifier inputs.

Referring to FIG. 3, the phase $\phi_1$ of the voltage in the first series tuned circuit formed by the first inductor 20 and the first input capacitance $C_1$ depends on the frequency of the signal source 10, changing from +90° to −90°, and passing through zero at the resonant frequency $F_1$ of the first tuned circuit. Similarly, the phase $\phi_2$ of the voltage in the second tuned circuit formed by the second inductor 30 and the second input capacitance $C_2$ depends on the frequency of the signal source 10, changing from +90° to −90°, and passing through zero at the resonant frequency $F_2$ of the second tuned circuit. The inductor values are selected such that the resonant frequencies $F_1$ and $F_2$ are respectively above and below the desired operating centre frequency $F_0$ of the circuit, and such that, at the desired operating centre frequency $F_0$ the voltages in each series resonant circuit are 180° apart. The operating centre frequency may be, for example, around 2.4 GHz.

In order to match the real, i.e. not complex, impedance 6 of the unbalanced signal source 10 to the balanced amplifier inputs 1 and 2, there are two requirements. First, the first and second inductors 20 and 30, in conjunction with the parasitic capacitance $C_1$ and $C_2$ of the amplifier first and second inputs 1 and 2, should present a real impedance to the signal source, and second, it must be possible to adjust the impedance value to approximately match the signal source impedance. These two requirements are considered in turn below by reference to a mathematical representation of the circuit shown in FIG. 2.

For clarity of explanation, the following approximations are made. It is assumed that the internal resistance of the first and second inductors 20 and 30 is equal, i.e. $R_1=R_2=R$. In practice, these values may be different and may be determined by measurement. In addition, it is assumed that the parasitic capacitance of the amplifier first and second inputs 1 and 2 is equal, i.e. $C_1=C_2=C$. In practice, these values are a characteristic of the integrated circuit manufacturing process, are closely matched, and are normally available from the integrated circuit manufacturer.

The input impedance $Z_{in}$ of the circuit comprising the first and second inductors 20 and 30 and the parasitic capacitance $C_1$ and $C_2$, at the input port 4, and at a frequency $\omega$, is given by:

$$\frac{\left[R + j\left(\omega L_1 - \frac{1}{\omega C}\right)\right]\left[R + j\left(\omega L_2 - \frac{1}{\omega C}\right)\right]}{2R + j\left[\omega(L_1 + L_2) - \frac{2}{\omega C}\right]}$$

This equation can be rearranged to give the input impedance $Z_{in}$ as:

$$\frac{R^2 - \left(\omega L_1 - \frac{1}{\omega C}\right)\left(\omega L_2 - \frac{1}{\omega C}\right) + jR\left[\omega(L_1 + L_2) - \frac{2}{\omega C}\right]}{2R + j\left[\omega(L_1 + L_2) - \frac{2}{\omega C}\right]}$$

By inspection, the input impedance $Z_{in}$ is real when:

$$\frac{\omega(L_1 + L_2)}{2} = \frac{1}{\omega C}$$

$$i.e.\ \omega^2 C\left[\frac{L_1 + L_2}{2}\right] = 1$$

Setting $L_\Sigma = \frac{L_1 + L_2}{2}$ the condition for the input impedance $Z_{in}$ to be real is therefore:

$$\omega^2 L_\Sigma C = 1$$

The impedance $Z_{in}$ may be made real at a desired operating centre frequency $F_0$ by selecting the values of the first and second inductances $L_1$ and $L_2$ such that the resonant frequency of the parasitic capacitance C with the average of the first and second inductance values is equal to the operating centre frequency $F_0$. This is equivalent to stating that, for the impedance $Z_{in}$ to be real at the operating centre frequency $F_0$, the values of the first and second inductances $L_1$ and $L_2$ are selected such that the operating centre frequency $F_0$ is equally spaced between the resonant frequency $F_1$ of first inductor $L_1$ with the amplifier first input 1 parasitic capacitance $C_1$, and the resonant frequency $F_2$ of second inductor $L_2$ with the amplifier second input 2 parasitic capacitance $C_2$.

Setting $$L_\Delta = \frac{L_1 + L_2}{2}$$

it may be shown that at the operating centre frequency $F_0$, the input impedance $Z_{in}$ is given by:

$$\frac{R}{2}\left(1 + \frac{\omega^2 L_\Delta^2}{R^2}\right)$$

The internal resistance is generally predetermined by the inductor components, but the input impedance $Z_{in}$ can be adjusted by changing the difference between the two inductance values $L_1$ and $L_2$. For example, in order to match a signal source 10 having an internal resistance 6 of 50Ω, the inductance values $L_1$ and $L_2$ may be selected to give an input impedance $Z_{in}$ of 50Ω, thereby adjusting the resonant frequencies $F_1$ and $F_2$ while maintaining the desired operating centre frequency $F_0$.

The phase of the series tuned circuits may also be described mathematically as follows. From elementary circuit analysis, the voltage $V_1$ at the amplifier first input 1, relative to the voltage $V_{in}$ delivered to the input port 4 by the signal source 10 is:

$$\frac{V_1}{V_{in}} = \frac{\frac{1}{j\omega C}}{R + j\omega L_1 + \frac{1}{j\omega C}}$$

Similarly, the voltage $V_2$ at the amplifier second input 2, relative to the voltage $V_{in}$ delivered to the input port 4 by the signal source 10 is:

$$\frac{V_2}{V_{in}} = \frac{\frac{1}{j\omega C}}{R + j\omega L_2 + \frac{1}{j\omega C}}$$

Using the condition $\omega^2 L_\Sigma C = 1$ derived above gives:

$$\frac{V_1}{V_{in}} = \frac{-j\omega L_\Delta}{R + j\omega L_\Delta} \text{ and } \frac{V_2}{V_{in}} = \frac{-j\omega L_\Delta}{R - j\omega L_\Delta}$$

When $\omega L_\Delta >> R$ the voltages $V_1$ and $V_2$ at the first and second amplifier inputs 1, 2 are 180° apart. If the internal resistance R becomes larger, the accuracy of the balance degrades.

The above mathematical analysis is based on the assumption that the internal resistance of the first and second inductors 20 and 30 is equal, i.e. $R_1 = R_2 = R$. In practice there is likely to be a small difference between these internal resistance values. A small difference may introduce a small deviation in the values of inductance $L_1$ and $L_2$ required to optimise the phase difference and optimise the impedance. Optimisation of the component values may be performed by standard circuit simulation and/or component substitution techniques.

Figure 4:
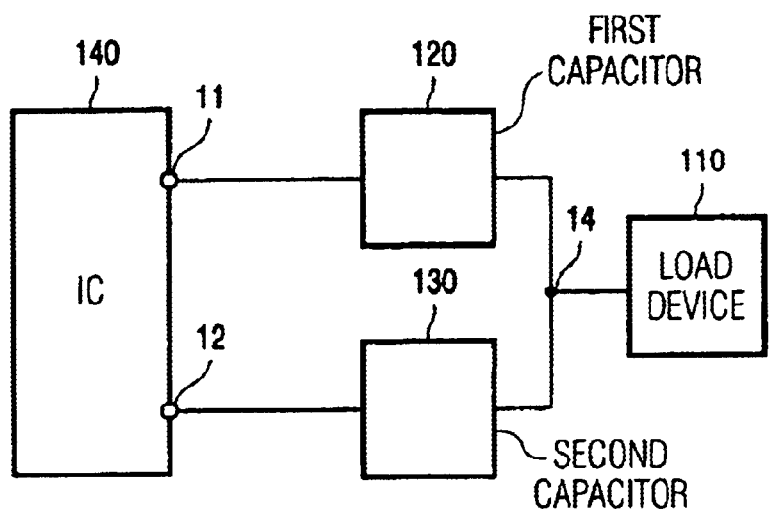
FIG. 4 is a block schematic diagram illustrating a second embodiment of the circuit.
Figure 5:
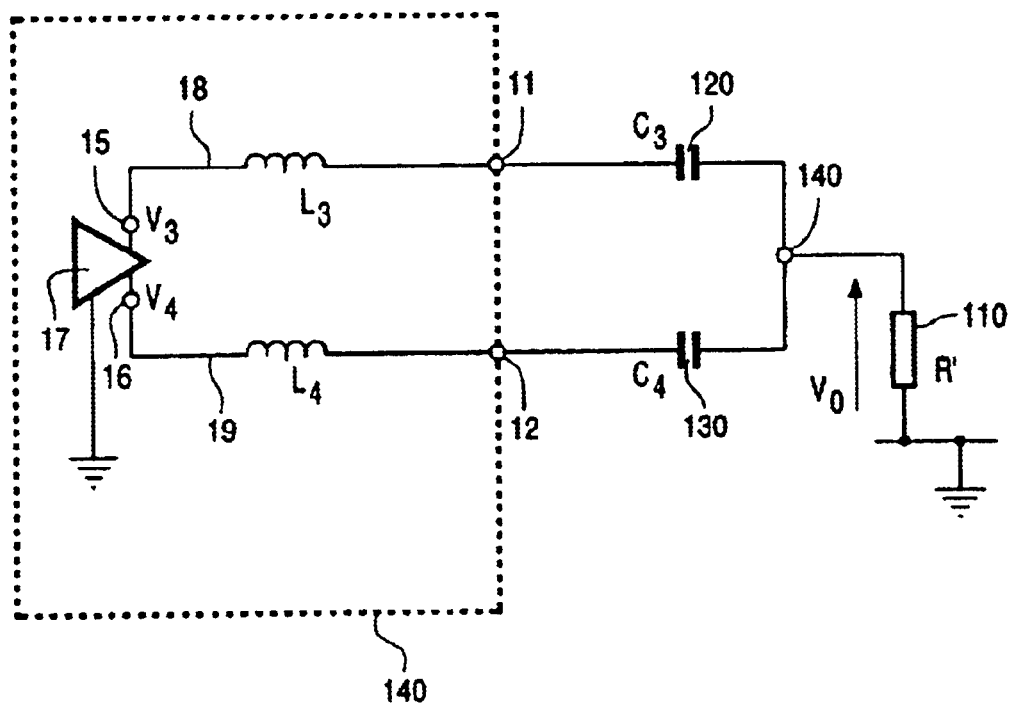
FIG. 5 is a schematic circuit diagram of the circuit embodiment in FIG. 4.

Referring to FIGS. 4 and 5 which illustrate a second embodiment of the invention, there is shown an integrated circuit 140 having first and second output connection pins 11, 12. The integrated circuit may be, for example, a radio transmitter. The first output connection pin 11 is coupled to a first capacitor 120, and an output from the first capacitor 120 is coupled to an output port 14. The second output connection pin 12 is coupled to a second capacitor 130, and an output from the second capacitor 130 is coupled to the output port 14. A load device 110 is connected between the output port 14 and electrical ground.

Referring to FIG. 5, the first capacitor 120 has a value $C_3$ and the second capacitor 130 has a value $C_4$, and the load device 110 is represented by an impedance of value R'. Internal to the integrated circuit 140, there is a die including a differential signal source 17 having first and second outputs configured as a balanced pair and supplied to first and second bond pads 15, 16, respectively, and supplying first and second voltages $V_3$ and $V_4$ respectively. There is a first bond wire 18 coupling the first bond pad 15 to the first output connection pin 11, and a second bond wire 19 coupling the second bond pad 16 to the second output connection pin 12. The first and second bond wires 18, 19 each have an inherent parasitic inductance which is represented in FIG. 5 by inductors of value $L_3$ and $L_4$ respectively connected between the each bond pad 15, 16 and the respective output connections 11, 12. Other internal circuitry of the integrated circuit 140 is not shown in FIG. 5 because it is not essential to the understanding of the present invention. Other inputs to, and outputs from, the integrated circuit 140 which are not essential to the understanding of the present invention are not shown.

A first tuned circuit of the second embodiment is formed by the combination of the first bond wire inductance $L_3$ and the first capacitor 120, and resonates at a frequency $F_3$, and a second tuned circuit of the second embodiment is formed by the combination of the second bond wire inductance $L_4$ and the second capacitor 130, and resonates at a frequency $F_4$. The parasitic inductance of the interconnections between the first and second output connection pins 11, 12 and the first and second capacitors 120, 130, and between the first and second capacitors 120, 130 and the output port 14 is negligible.

Figure 6:
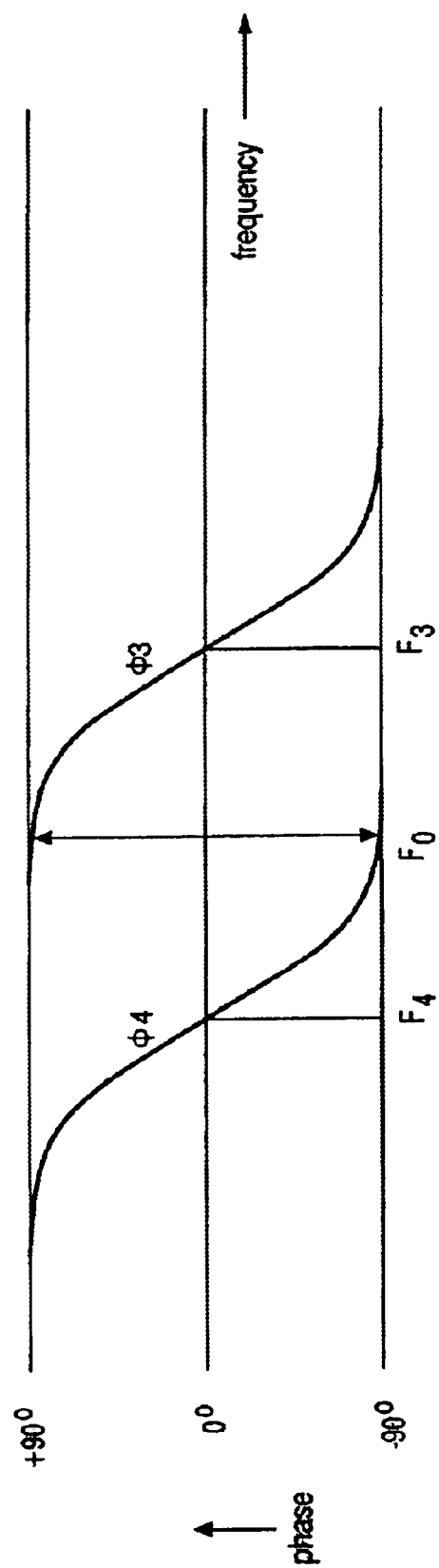
FIG. 6 is a plot of the phase of the voltage in tuned circuits.

Referring to FIG. 6, the phase $\phi_3$ of the voltage in the first tuned circuit depends on the frequency of the signal source 17, changing from +90° to −90°, and passing through zero at the resonant frequency $F_3$. Similarly, the phase $\phi_4$ of the voltage in the second tuned circuit depends on the frequency of the signal source 17, changing from +90° to −90°, and passing through zero at the resonant frequency $F_4$. The first and second capacitor values $C_2$, $C_4$ are selected such that the resonant frequencies $F_2$ and $F_4$ are respectively above and below a desired operating centre frequency $F_0$ of the signal source, and such that, at the desired operating centre frequency $F_0$ the voltages in each series resonant circuit are 180° apart. The operating centre frequency may be, for example, around 2.4 GHz.

Additionally, the first and second capacitor values $C_3$, $C_4$ may be selected to present a desired impedance to the differential signal source first and second outputs.

The selection criteria for the first and second capacitor values are illustrated below by reference to a mathematical representation of the circuit shown in FIG. 5.

The impedance of the first tuned circuit at a frequency $\omega$ is:

$$j\omega L_3 + \frac{1}{j\omega C_3} = +jX$$

At the operating centre frequency, the impedance of the second tuned circuit is 180° out of phase with respect to the first tuned circuit i.e.

$$j\omega L_4 + \frac{1}{j\omega C_4} = -jX$$

In this case, it may be shown that the voltage $V_0$ at the output port 14 is:

$$V_0 = -j\frac{R'}{X}(V_3 - V_4)$$

and the circuit performs the function of a balun, summing the first differential source output voltage $V_3$ with the inverted second differential source output voltage $V_4$.

Also, it may be shown that the impedance presented to the signal source first output at the first bond pad 15, at the operating centre frequency, is:

$$\frac{jX}{1 + j2R'/X}$$

and the impedance presented to the signal source second output at the second bond pad 16, at the operating centre frequency, is:

$$\frac{jX}{-1 + j2R'/X}$$

If R'>>X, then the impedance presented to each output of the differential signal source 17 is $X^2/2R'$, and both outputs of the signal source 17 are presented with very small and equal impedances. These characteristics can be beneficial when, for example, the integrated circuit is a power amplifier and the load device is an antenna.

A further characteristic of the invention is that higher harmonics of the signal delivered by the signal source 17 are filtered out by the first and second tuned circuits.

The values of the parasitic inductance $L_3$ and $L_4$ may be known from data supplied by the integrated circuit manufacturer or may be determined using standard circuit simulation and measurement techniques. Selection of the first and second capacitor values $C_3$ and $C_4$ may be performed by standard circuit calculation, simulation and/or measurement techniques.

In the embodiment described above, the sole sources of parasitic inductance are the bond wires within the integrated circuit package. In other embodiments of the invention there may be other sources of parasitic inductance between the outputs of the differential signal source 17 and the output port 14, such as printed circuit board tracks delivering signals to the capacitors 120, 130 or to the output port 14. Also, parasitic inductance within the integrated circuit package may be effectively eliminated by means of different types of integrated circuit package, or by using naked die. In these cases the values of the first and second parasitic inductances $L_3$ and $L_4$ may be selected in design calculations to account for all sources of parasitic inductance between the differential signal source 17 and the output port 14.

In the present specification and claims the word "a" or "an" preceding an element does not exclude the presence of a plurality of such elements. Further, the word "comprising" does not exclude the presence of other elements or steps than those listed.

From reading the present disclosure, other modifications will be apparent to persons skilled in the art. Such modifications may involve other features which are already known in the art of RF engineering and circuit design and which may be used instead of or in addition to features already described herein.

What is claimed is:

1. An RF electrical circuit configured to match an unbalanced input port terminal to first and second terminals of a balanced port, comprising first and second branches, the first branch comprising a first DC and AC path coupling the unbalanced input port terminal to the first terminal of the balanced port and the second branch comprising a second DC and AC path coupling the same unbalanced input port terminal to the second terminal of the balanced port, the first path comprising a first reactive element and the second path comprising a second reactive element, wherein the first reactive element resonates at a first resonant frequency with a first parasitic reactance associated with the first branch, wherein the second reactive element resonates at a second resonant frequency with a second parasitic reactance associated with the second branch, wherein the first resonant frequency is higher than a predetermined operating centre frequency and the second resonant frequency is lower than the predetermined operating centre frequency, and wherein signals delivered to a load from the first and second branches are 180° out of phase with respect to each other.

2. A circuit as claimed in claim 1, wherein the balanced port comprises an amplifier and the first and second terminals of the balanced port comprise respectively amplifier first and second inputs, wherein the first branch comprises the amplifier first input and the second branch comprises the amplifier second input, wherein the first reactive element comprises a first inductor having a first inductance and the second reactive element comprises a second inductor having a second inductance, and wherein the first parasitic reactance associated with the first branch comprises an input capacitance of the amplifier first input and the second parasitic reactance associated with the second branch comprises an input capacitance of the amplifier second input.

3. A circuit as claimed in claim 2, in which the first and second inductances are selected such that the input impedance at the unbalanced port is substantially equal to the output impedance of a signal source.

4. A circuit as claimed in claim 2, in which the first and second inductances are selected such that the input impedance at the unbalanced port is substantially 50Ω.

5. A circuit as claimed in claim 2, in which the amplifier is implemented in CMOS.

6. A radio receiver comprising a circuit as claimed in claim 1.

7. A circuit as claimed in claim 1, wherein the balanced port comprises an integrated circuit die and the first and second terminals of the balanced port comprise respectively first and second outputs of a differential signal source on respectively first and second connection areas of the integrated circuit die, wherein the first branch comprises the integrated circuit die first output and the second branch comprises the integrated circuit die second output, wherein the first reactive element comprises a first capacitor having a first capacitance and the second reactive element comprises a second capacitor having a second capacitance, wherein the first parasitic reactance associated with the first branch comprises a first parasitic inductance and the second parasitic reactance associated with the second branch comprises a second parasitic inductance.

8. A circuit as claimed in claim 7, in which the first and second parasitic inductances occur at least partly on the unbalanced port side of the first and second capacitors respectively.

9. A circuit as claimed in claim 7, in which the first and second parasitic inductances occur at least partly on the integrated circuit side of the first and second capacitors respectively.

10. A circuit as claimed in claim 9, in which the first and second parasitic inductances occur at least partly internally to an integrated circuit package.

11. A circuit as claimed in claim 10, in which the first and second parasitic inductances are at least partly due to integrated circuit bond wires.

12. A circuit as claimed in claim 9, in which the first and second parasitic inductances occur at least partly externally to an integrated circuit package.

13. A circuit as claimed in any one of claims 7, in which the impedance presented to both of the first and second outputs of the differential signal source is substantially equal.

14. A radio transmitter comprising the circuit as claimed in claim 1.

* * * * *